(12) United States Patent
Yu et al.

(10) Patent No.: US 8,432,040 B2
(45) Date of Patent: Apr. 30, 2013

(54) INTERCONNECTION STRUCTURE DESIGN FOR LOW RC DELAY AND LEAKAGE

(75) Inventors: Chen-Hua Yu, Hsin-Chu (TW); Ming-Shih Yeh, Chupei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 1710 days.

(21) Appl. No.: 11/444,629

(22) Filed: Jun. 1, 2006

(65) Prior Publication Data

US 2007/0278681 A1 Dec. 6, 2007

(51) Int. Cl.
*H01L 29/41* (2006.01)

(52) U.S. Cl.
USPC ............ 257/774; 257/E21.575; 257/E21.577; 257/E21.579

(58) Field of Classification Search .................. 257/774, 257/758, 750, 700, E23.145, E21.575, E21.577, 257/E21.579, 775, 759, 760
See application file for complete search history.

(56) References Cited

U.S. PATENT DOCUMENTS

| | | | |
|---|---|---|---|
| 6,348,233 B2 * | 2/2002 | Brody et al. | 427/117 |
| 6,559,548 B1 * | 5/2003 | Matsunaga et al. | 257/774 |
| 6,764,810 B2 | 7/2004 | Ma et al. | |
| 6,812,043 B2 | 11/2004 | Bao et al. | |
| 7,075,182 B2 * | 7/2006 | Mitani et al. | 257/758 |
| 2005/0032355 A1 | 2/2005 | Yeh et al. | |

OTHER PUBLICATIONS

Nguyen, V.H., et al., "An Analysis of the Effect of Wire Resistance on Circuit Level Performance at the 45-nm Technology Node," International Interconnect Technology Conference 2005, 3 pages.

* cited by examiner

*Primary Examiner* — Eduardo A Rodela
(74) *Attorney, Agent, or Firm* — Slater & Matsil, L.L.P.

(57) ABSTRACT

An interconnection structure for integrated circuits having reduced RC delay and leakage is provided. The interconnection structure includes a first conductive line in a first dielectric layer, a second dielectric layer over the first dielectric layer and the first conductive line, and a dual damascene structure in the second dielectric layer. The dual damascene structure includes a second conductive line and a via between and adjoining the first and the second conductive lines, wherein the second conductive line comprises a first portion directly over and adjoining the via, and a second portion having no underlying and adjoining vias. The second portion has a second width less than a first width of the first portion.

8 Claims, 10 Drawing Sheets

INTERCONNECTION STRUCTURE DESIGN FOR LOW RC DELAY AND LEAKAGE

TECHNICAL FIELD

This invention relates generally to the formation of interconnection structures in integrated circuits, and more particularly to the layout of metal lines in metallization layers and connecting vias.

BACKGROUND

Modern integrated circuits are made up of literally millions of active devices such as transistors and capacitors. These devices are initially isolated from one another but are later interconnected together to form functional circuits. Typical interconnection structures include lateral interconnections, such as metal lines (wirings), and vertical interconnections, such as vias and contacts. The quality of the interconnection structure drastically affects the performance and reliability of the fabricated circuit. Interconnections are increasingly determining the limits of performance and the density of modern integrated circuits.

FIG. 1 is a cross-sectional illustration of a conventional interconnection structure used in the semiconductor industry. Metal lines 104 and 106, which are typically formed of copper, aluminum, or alloys thereof, are used to couple active devices (not shown) into functional circuits. A dielectric layer 108 electrically isolates an upper metallization layer and a lower metallization layer. Electrical connections between metallization layers are made between metal lines 104 and 106 through metal vias 110 and 112.

The pitch P in the upper metallization layer, which includes metal lines 104 and 106 is the sum of the metal line width W and line spacing S. Typically, the vias 110 and 112 have a width R of between about 0.45 P and about 0.5 P, the line spacing S is between about 0.4 P and about 0.5 P, and the line width W is between about 0.5 P and about 0.6 P. Therefore, in a typical interconnection design scheme, line spacing S is about one half of the pitch or slightly less.

The interconnection structure of FIG. 1 suffers drawbacks, however. As the existing back end of line (BEOL) design rules require a decreasing pitch P for laying out metal lines in interconnection structures, the line spacing S becomes very small also. This causes the parasitic capacitance between interconnection lines 104 and 106 to be high. As a result, the RC delay of the integrated circuits increases. Additionally, with a smaller spacing S between the metal lines, leakage current may become significant.

An article by Viet H. Nguyen, et al., entitled "An Analysis of the Effect of Wire Resistance on Circuit Level Performance at the 45-nm Technology Node," has pointed out that parasitic capacitance has a much larger impact on RC delay than does line resistance for most of the random logic circuits with a local interconnect length of less than about 1000 µm, and even more particularly less than about 500 µm. When the interconnection lines are longer than about 1000 µm, the line resistance starts to dominate the RC delay.

Further research has revealed that in typical low BEOL loading products, for example, communication chips, about 70 to 80 percent of the lengths of the interconnection lines are 500 µm or less. Therefore, by reducing parasitic capacitances, the RC delays on about 70 to 80 percent of the interconnection lines can be noticeably improved.

One way to reduce parasitic capacitance is to lower the dielectric constant of the inter-metal dielectric layer 108. However, the k value of the inter-metal dielectric layer 108 has typically already been lowered to what existing technology allows. Besides, lowering the k value of inter-metal dielectric layer 108 is accompanied by the side effects of weaker mechanical properties and higher vulnerability to the "poisoning" of process chemicals.

Therefore, what is needed is a novel interconnection structure design so that RC delay and leakage currents are reduced without compromising other characteristics of the integrated circuits.

SUMMARY OF THE INVENTION

In accordance with one aspect of the present invention, the interconnection structure includes a first conductive line in a first dielectric layer, a second dielectric layer over the first dielectric layer and the first conductive line, and a dual damascene structure in the second dielectric layer. The dual damascene structure includes a second conductive line and a via between and adjoining the first and the second conductive lines, wherein the second conductive line comprises a first portion directly over and adjoining the via, and a second portion having no underlying and adjoining vias. The second portion has a second width less than a first width of the first portion.

In accordance with another aspect of the present invention, at least one of the second width and a width of the first conductive line is between about 65 percent to about 95 percent a width of the via.

In accordance with yet another aspect of the present invention, the interconnection structure further includes a third conductive line in a same metallization layer as the second conductive line, wherein the second and the third conductive lines are parallel and have a spacing, and wherein the second width is preferably less than the spacing, and more preferably between about 70 and about 95 percent of the spacing.

The advantageous features of the present invention include reduced RC delay, reduced leakage currents between interconnection lines, and less power consumption.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

A novel interconnection structure is illustrated. Throughout the various views and illustrative embodiments of the present invention, like reference numbers are used to designate like elements. Although the preferred embodiments of the present invention are related to the design of interconnection structures concerning vias and metal lines, the same concept is readily available to the design of contact plugs and overlying metal lines, provided the reduced width metal lines are adequate for carrying the currents.

Figure 1:
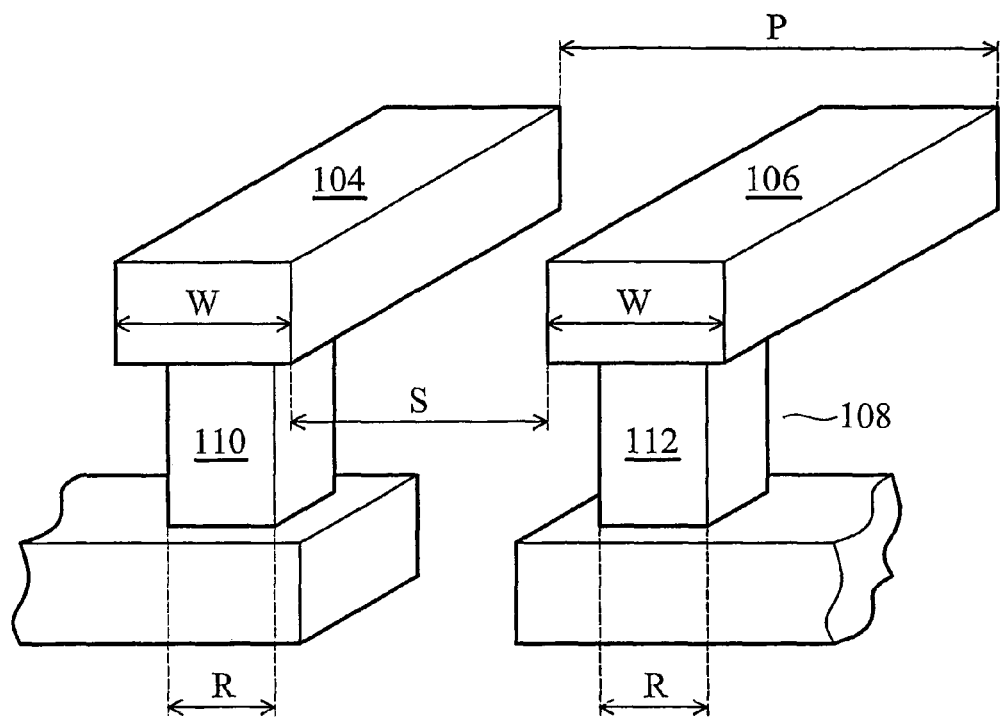
FIG. 1 illustrates a perspective view of a conventional interconnection structure.
Figure 2A:
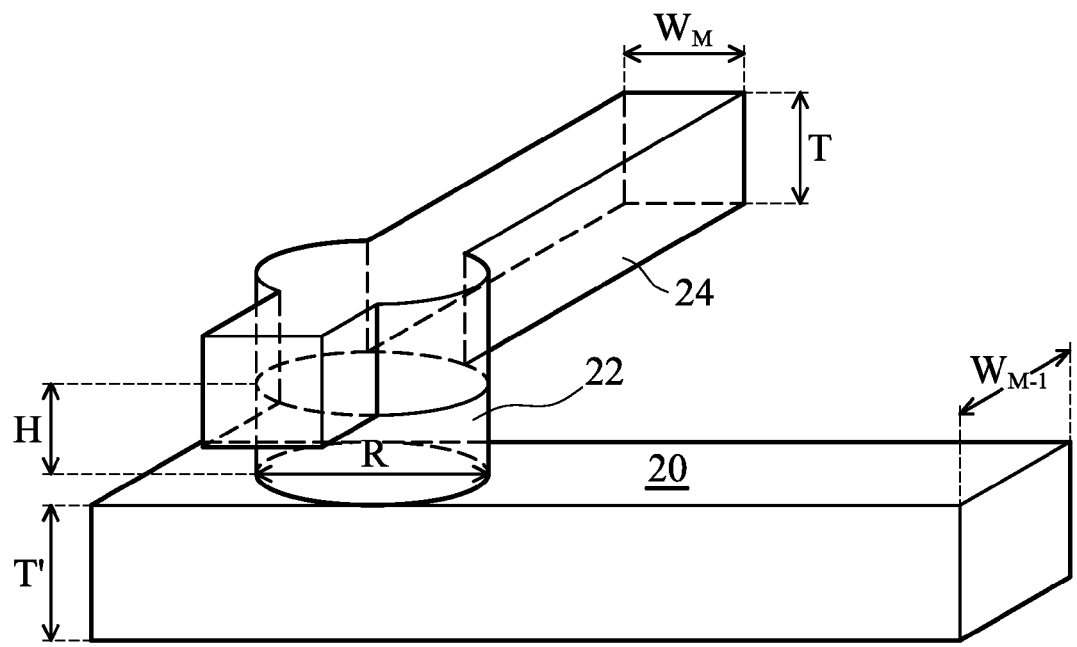
FIG. 2A illustrates a perspective view of the preferred embodiment of the present invention, wherein a via has a width greater than the width of the overlying metal line but equal to or less than the width of the underlying metal line.

A perspective view of a preferred embodiment of the present invention is shown in FIG. 2A. A lower metal line 20 is in a metallization layer M−1, and an upper metal line 24 is in a metallization layer M, wherein M is an integer greater than zero. A via 22 interconnects metal lines 20 and 24. The metal lines 20 and 24 have widths $W_{M-1}$, and $W_M$, respectively. Via 22 has a dimension R in the width direction of the metal line 24, thus the dimension R is also referred to as a width R.

In the preferred embodiment, the width $W_M$ of the upper metal line 24 is preferably less than the width R of the via 22, and more preferably between about 0.65 R and about 0.95 R, and even more preferably between about 0.65 R and about 0.85 R. One skilled in the art will realize that the optimum width of metal line 24 is partially determined by its current carrying ability, and can be determined through routine experiment once the teaching of the present application is understood. As a comparison, conventionally, widths of the upper metal lines were at least equal to, and more likely greater than, the width of the respective underlying vias.

In the preferred embodiments, metal line width increases as one mores from lower metallization layers to upper metallization layers. Therefore, width $W_{M-1}$ of the lower metal line 20 is preferably less than width $W_M$ of the upper metal line 24. Accordingly, width $W_{M-1}$ of the metal line 20 is preferably less than the width R of the via 22, and more preferably between about 0.85 R and about 0.95 R, and even more preferably between about 0.65 R and about 0.85 R or even smaller.

In the preferred embodiment, the width $W_M$ of the metal line 24 is greater than the width $W_{M-1}$ of the metal line 20. In other embodiments, width $W_M$ may also be equal to or less than the width $W_{M-1}$. The thicknesses T and T' of the respective metal lines 24 and 20 are preferably substantially equal to or greater than the height H of the via 22.

Figure 3A:
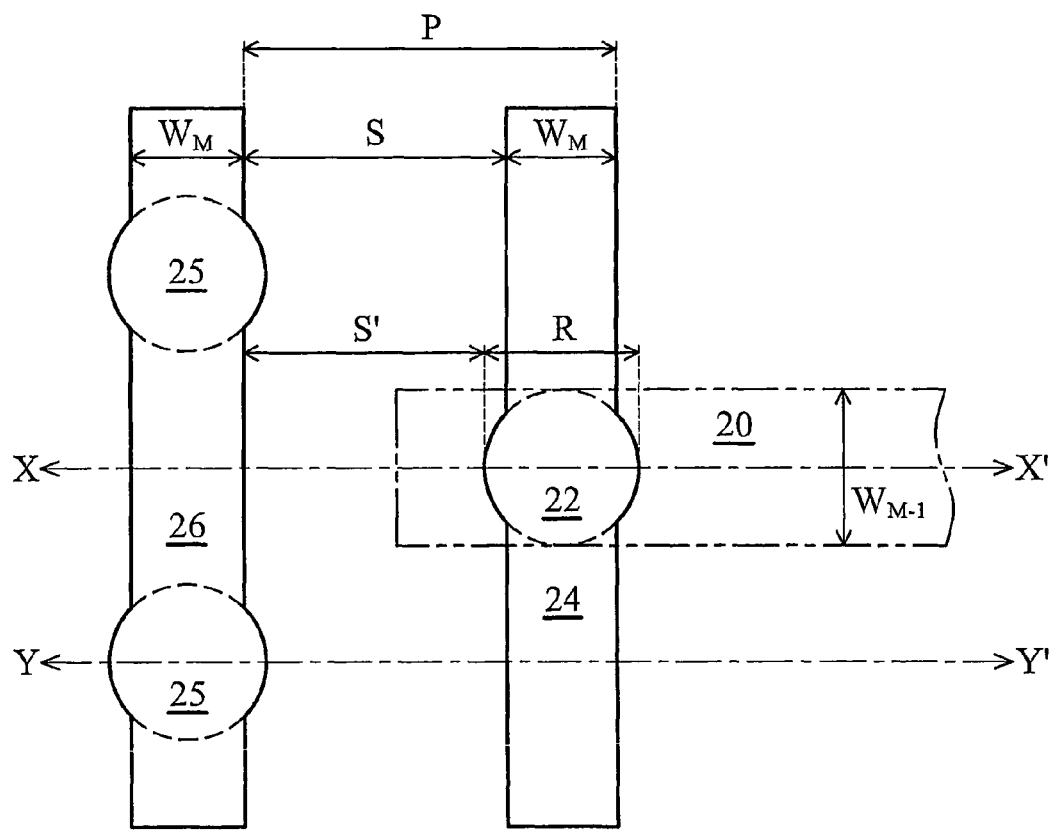
FIGS. 3A and 4 are top views of the embodiment shown in FIG. 2A.

A top view of the structure in FIG. 2A is shown in FIG. 3A, wherein features in FIG. 2A can be identified through like reference numerals. An additional metal line 26, which is parallel to metal line 24, is also illustrated for the purpose of showing the relationship between the metal lines. Preferably, the connecting vias 25 and 22 are not aligned in the width direction of the metal lines. Such an arrangement increases the design window or, in other words, reduces the likelihood of inadvertently bridging metal lines 24 and 26 by vias 25 and 22. The pitch P can be expressed as $(S+W_M)$, wherein S is the spacing between the metal lines 24 and 26, and $W_M$ is the width of metal lines 24 and 26. To maximize the effects of the preferred embodiment of the present invention, the lengths of each of the metal lines 24 and 26 are preferably less than about 500 μm, and more preferably less than about 100 μm, so that the reduction in RC delay due to the decrease of the parasitic capacitance is more significant. One skilled in the art will recognize that the present invention can nonetheless be implemented in lines that are longer.

Assuming the pitch P is the minimum pitch, and is fixed, the reduction of the metal line width $W_M$ results in an increase of the spacing S. In the preferred embodiment, the width $W_M$ is about 0.4 P to about 0.45 P, while the spacing S is about 0.55 P to about 0.6 P, as compared to about 0.45 P to about 0.5 P in the conventional design.

With a fixed minimum pitch, when the width $W_M$ is reduced, a relative ratio of the line width $W_M$ to the line spacing S is reduced accordingly. In the preferred embodiment, line width $W_M$ and $W_{M-1}$ are reduced to less than the line spacing S. More preferably, line widths $W_M$ and $W_{M-1}$ are about 70 to about 95 percent of the line spacing S.

Since the parasitic capacitance is inversely proportional to the distance between the metal lines 24 and 26, the increase of the spacing S results in a significant decrease in the parasitic capacitance. This improvement comes with no additional overhead of chip area since the pitch P is fixed. Also note that due to the narrowing of the metal lines 24 and 26, the spacing S' between the via and the metal line is also increased, which means that the design window is increased, and vias are less likely to bridge to neighboring metal lines due to process variations.

Figure 4:
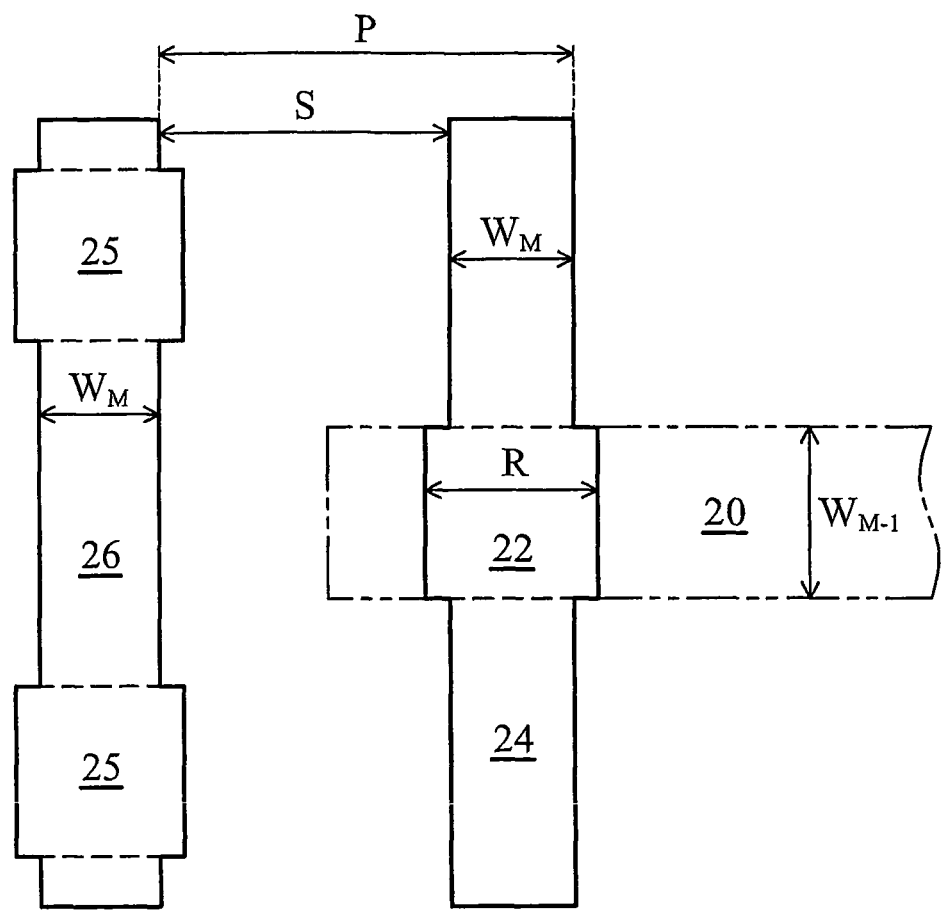

Although the via 22 in FIG. 2A and FIG. 3A is shown as having a circular shape, typically, vias are laid out as squares, as shown in FIG. 4. Due to optical effects, the resulting shapes of the vias will change, and the resulting shape varies. Regardless of the shape of the vias fabricated, the width R is defined to be the maximum dimension of the via in the length direction of the overlying connecting metal line.

Figure 2B:
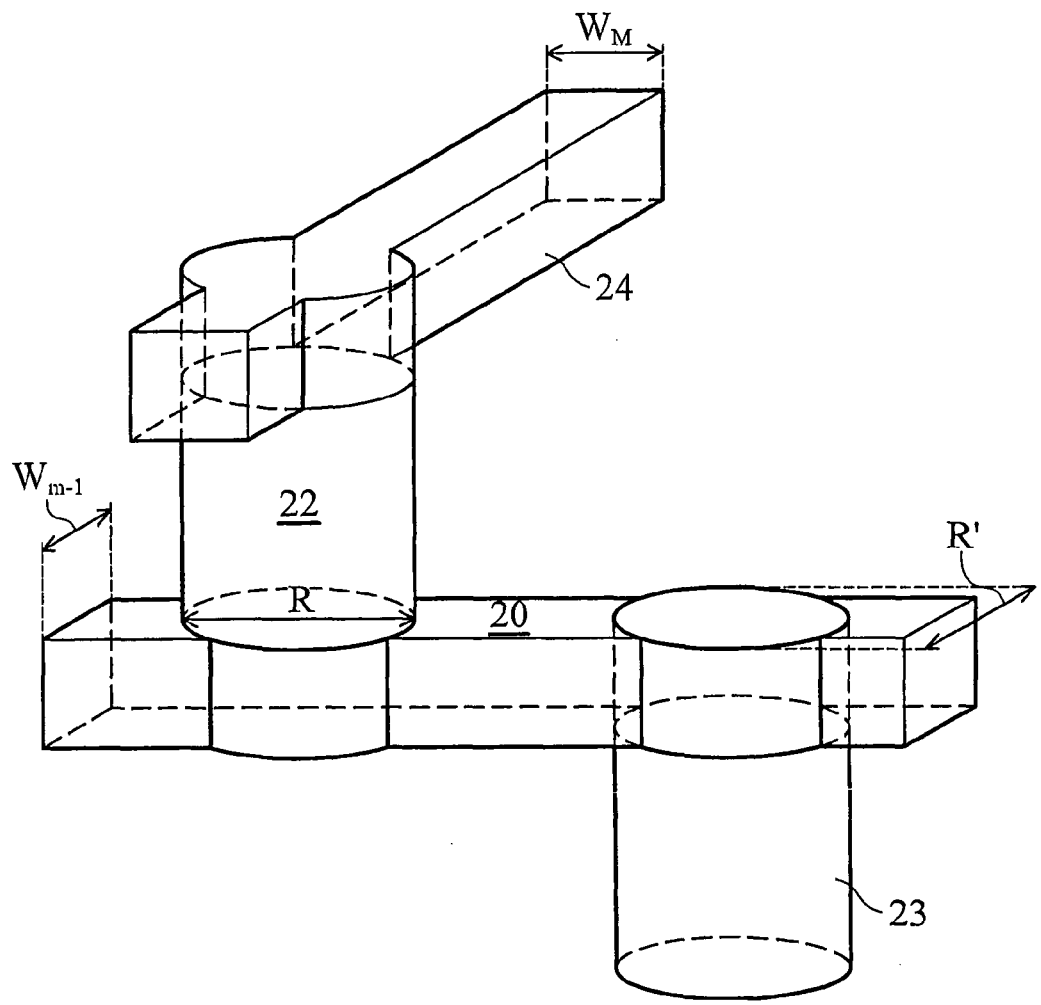
FIGS. 2B and 3B are a perspective view and a top view, respectively, of the preferred embodiment of the present invention, wherein a via has a width greater than the width of the underlying metal line and the width of the overlying metal line.
Figure 3B:
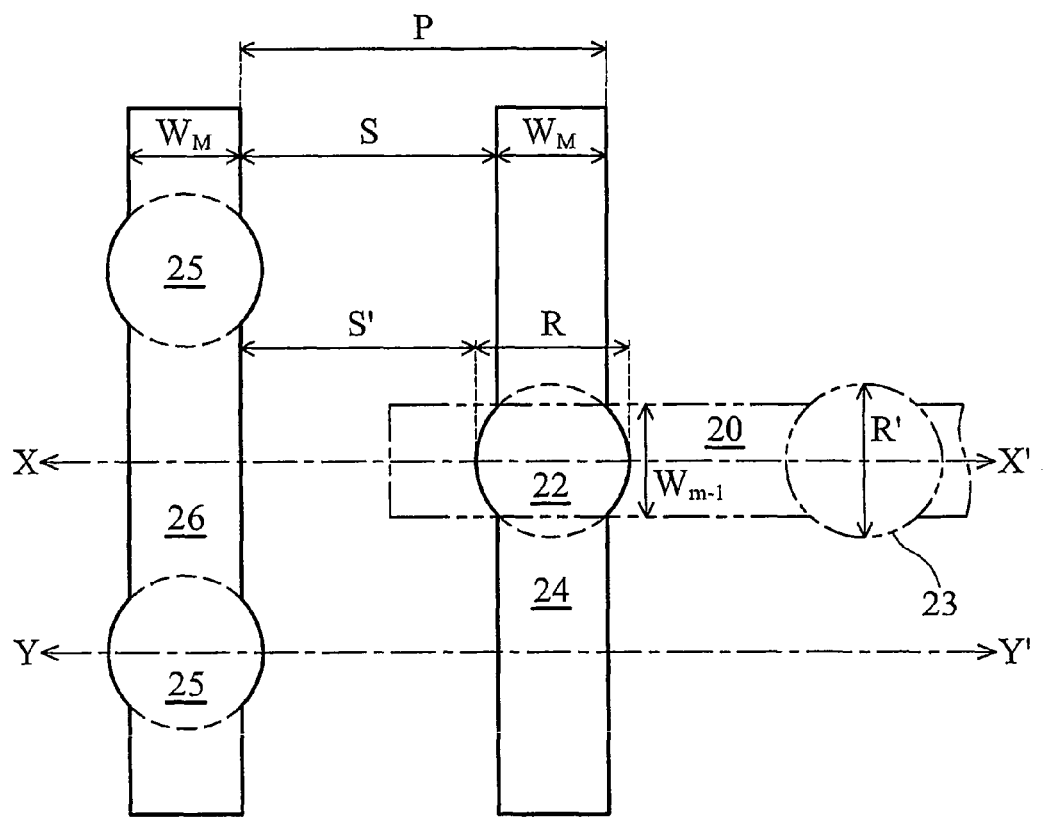

An alternative embodiment is shown in FIGS. 2B and 3B, wherein FIG. 2B illustrates a perspective view and FIG. 3B illustrates a top view. In addition, a neighboring metal line 26 is also shown in FIG. 3B to illustrate the relationship between neighboring features. This embodiment is similar to the embodiment shown in FIGS. 2A, 3A and 4, except that via 22 has a width R greater than both the width $W_M$ of the overlying metal line 24 and the width $W_{M-1}$ of the underlying metal line 20. Both widths $W_M$ and $W_{M-1}$ are each preferably between about 0.85 R and about 0.95 R, and even more preferably between about 0.65 R and about 0.85 R, or even smaller.

In yet other embodiments, a via 23 is formed underlying and connected to metal line 20. The width $W_{M-1}$ of metal line 20 is preferably less than both the width R of the via 22 and the width (denoted as R') of the underlying via 23. Preferably, the width $W_{M-1}$ of metal line 20 is between about 0.85 R' and about 0.95 R', and even more preferably between about 0.65 R' and about 0.85 R', or even smaller.

FIGS. 5 through 9 illustrate cross-sectional views of intermediate stages in the fabrication of the preferred embodiment, wherein the cross-sectional views are taken from a plane crossing a line X-X' in FIG. 3A unless otherwise specified. For illustration purposes, a single damascene process followed by a dual damascene process is performed to form lower metal lines, vias and upper metal lines.

Figure 5:
FIGS. 5 through 10 are cross-sectional views of intermediate stages in the manufacture of an interconnection structure, wherein a single damascene and a dual damascene process are used.
Figure 6:
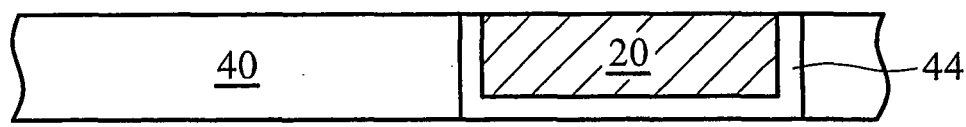

FIGS. 5 and 6 show a single damascene process for forming the metal line 20. Referring to FIG. 5, a trench 42 is formed in a dielectric layer 40, preferably by etching. The dielectric layer 40 is preferably an inter-metal dielectric (IMD) layer formed over other interconnection structures (not shown), such as vias and contact plugs. A diffusion barrier layer 44 and the metal line 20 are formed in the trench 42, as shown in FIG. 6. The barrier layer 44 is preferably formed of a material comprising titanium, titanium nitride, tantalum, tantalum nitride, or other alternatives. Metal line 20 preferably comprises copper or copper alloys, although it may comprise other conductive materials such as aluminum, silver, gold, and the like, and combinations thereof. In the preferred embodiment, metal line 20 is formed by depositing a thin layer of seed copper or copper alloy, then plating to fill the trench 42. In other embodiments, commonly used chemical vapor deposition (CVD) methods such as plasma enhanced CVD can be used. A chemical mechanical polish (CMP) is performed to level the top surfaces of the metal line 20 and dielectric layer 40.

In the preferred embodiment, after the conductive line 20 is formed, a dual damascene process is performed to form via 22 and conductive lines 24 and 26. For illustration purposes, only a via-first approach is discussed. One skilled in the art will realize that the preferred embodiments of the present invention are also well suited for trench-first approaches.

Figure 7:
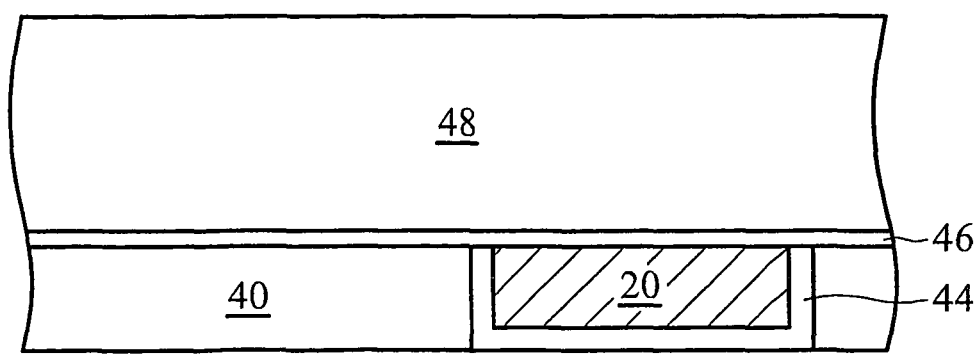

Referring to FIG. 7, an etch stop layer 46 is formed, followed by the formation of an IMD layer 48. The IMD layer 48 preferably has a k value of less than about 3.0, and more preferably less than about 2.5, and even more preferably less than about 2.2. The preferred materials include fluorine-containing materials such as fluorosilicate glass (FSG) and fluorine-doped silicon oxycarbide, carbon-containing materials such as silicon oxycarbide and silicon carbide, sulfur-containing materials such as sulfur-doped silicon oxycarbide and sulfur-doped silicon oxide, boron-containing materials such as boron-doped silicon oxycarbide and boron-doped silicon oxide.

Figure 8:
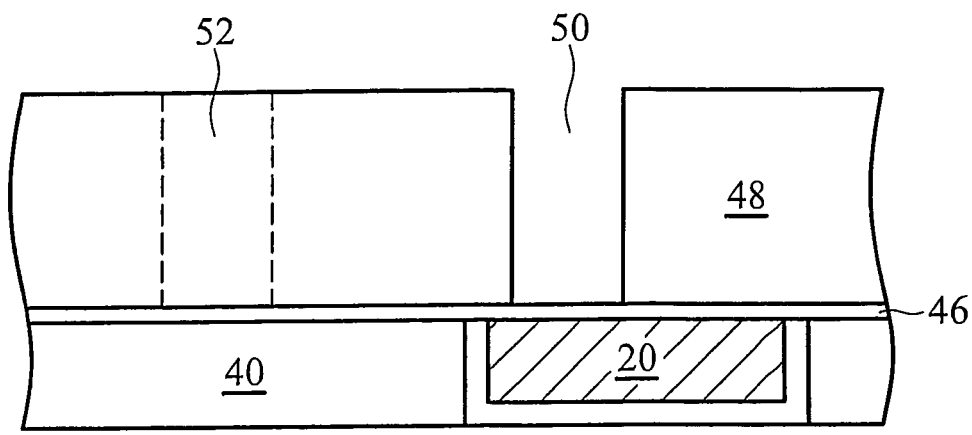

FIG. 8 illustrates the formation of via openings 50 and 52. In the preferred embodiment, a conductive hard mask scheme is used, in which a conductive hard mask (not shown) and a photo resist (not shown) are formed for the formation of via openings and trench openings. In an exemplary embodiment, the conductive hard mask comprises metal nitride or doped (or non-doped) polysilicon or amorphous silicon. In other embodiments, a photo resist is used with no conductive hard mask formed. An anisotropic etching cuts through the IMD layer 48 and stops at the etch stop layer 46, forming via openings 50 and 52. The via opening 52 is in a plane crossing a line Y-Y' (refer to FIG. 3A), thus is shown with dotted lines.

Figure 9:
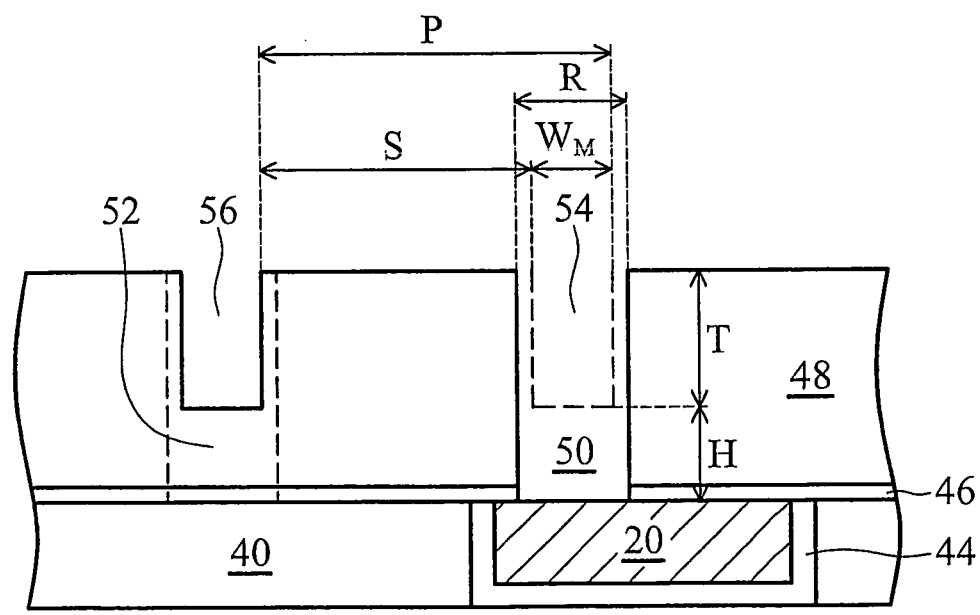

FIG. 9 illustrates the formation of trench openings 54 and 56. With the masking of a photo resist (not shown), an anisotropic etching cuts through IMD layer 48 and stops at a desired depth T. Note that trench 54 is shown with dotted lines since it is in the plane Y-Y'. The width $W_M$ of the trenches 54 and 56 is preferably less than the width R of the via opening 50. Preferably, the remaining thickness H of the IMD 48 is equal to, and more preferably less than, the depth T of the trench openings 54 and 56. The depth T can be controlled by an etch stop layer (not shown) in the middle of IMD 48 as a buffer layer. In cases wherein no middle etch stop layer is used, the depth T is controlled by etching time. The preferred dimensions $W_M$, R, S and P and their relationship have been discussed in previous paragraphs, and thus are not repeated herein. The etch stop layer 46 is then etched at the bottom of the via openings 50 and 52, exposing conductive line 20.

Figure 10:
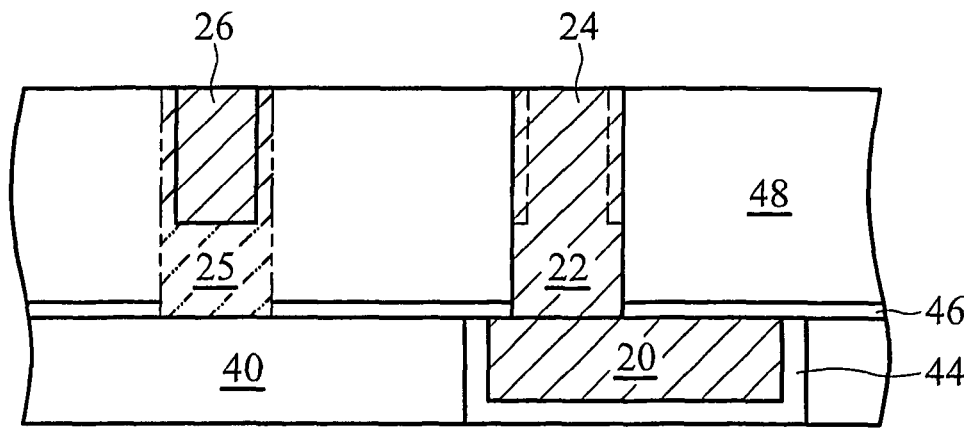
Figure 11:
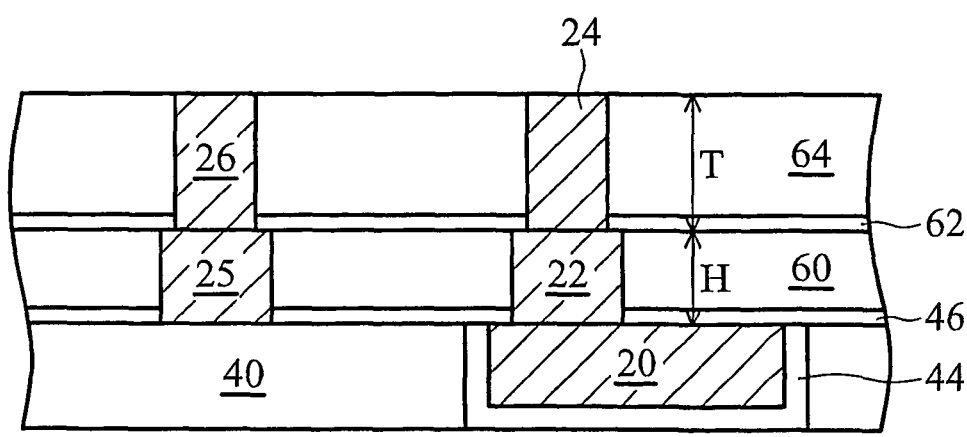
FIG. 11 illustrates an interconnection structure formed using single damascene processes.

FIG. 10 illustrates the formation of conductive lines 24 and 26 and vias 22 and 25. As is known in the art, a diffusion barrier layer (not shown) is preferably formed on inner surfaces of the via openings 50 and 52 and trench openings 54 and 56. The trench openings 54 and 56 and via openings 50 and 52 are then filled with a conductive material, which preferably comprises copper, aluminum, silver, gold, metal alloy, metal nitride, and the like. A CMP is then performed to remove excess material, leaving metal lines 24 and 26 and vias 22 and 25. Please note that by using one IMD layer to form vias and overlying metal lines, the contour of the vias extends upward into metal lines 24 and 26. However, if single damascene processes are used, as shown in FIG. 11, no via contour extension will occur.

Although in the previously discussed embodiment, vias 22, 25 and the conductive lines 24, 26 are formed in a same dielectric layer, one skilled in the art will realize that they can be formed in two separate dielectric layers. In alternative embodiments, vias 22, 25 and conductive lines 24, 26 can be formed using single damascene processes, and a resulting structure is shown in FIG. 11. The initial steps of this embodiment are the same as shown in FIGS. 5 and 6. The etch stop layer 46 and an IMD layer 60 are then formed. Vias 22, 25 are then formed by forming via openings, filling the via openings with metal, and performing a CMP. An etch stop layer 62 and a low-k dielectric layer 64 are then formed. Next, metal lines 24 and 26 are formed using similar methods as used for forming metal line 20. By using single damascene processes, the thickness H of the vias 22, 25 and the thickness T of the metal lines 24, 26 can be better controlled, as the thicknesses H and T are determined by the respective thicknesses of the dielectric layers 60 and 64. However, a dual damascene process will result in a lower effective dielectric constant.

It is well known that the RC delay in an integrated circuit decreases when the parasitic capacitance decreases. Experiments have also been performed to further reveal how the preferred embodiments of the present invention affect the RC delay. The experiments were performed using 300 μm long wires fabricated with 65 nm technology. It has been found that a 10 percent parasitic capacitance decrease will result in about a 6.7 percent decrease in RC delay. As can be found from the preferred embodiment, with a fixed pitch P (refer to FIG. 3A), when the spacing S increases from the original value of about 0.4 P to about 0.5 P to the new value of about 0.55 P to about 0.6 P, the respective parasitic capacitance between lines 24 and 26 decreases by between about 10 percent (assuming S increases from 0.5 P to 0.55 P) to about 33 percent (assuming S increases from 0.4 P to 0.6 P). The RC delay thus can be significantly reduced.

A further benefit is that with the reduction of leakage currents, power consumption is reduced. Additionally, with greater line spacing and less leakage currents, undesired phenomenon, such as electro-migration, are reduced, resulting in a reduced time-dependent dielectric breakdown, hence an increase in the lifetime of the integrated circuits.

Figure 12:
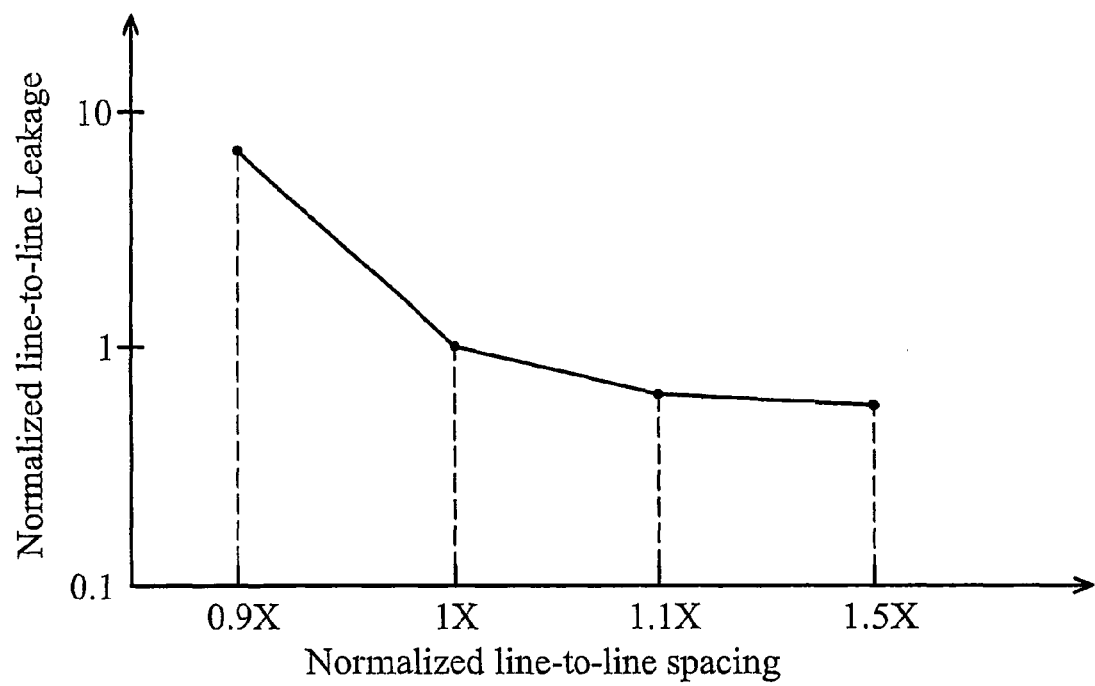
FIG. 12 illustrates normalized line-to-line leakage current as a function of normalized line-to-line spacing.

FIG. 12 illustrates experiment results showing the leakage current as a function of the line spacing. The Y-axis represents normalized line-to-line leakage currents and the X-axis represents normalized line-to-line spacing. It is noted that when line-to-line spacing increases about 10 percent (at 1.1×), the leakage current is reduced to about 90 percent of the original value. A 50 percent increase in line-to-line spacing (at 1.5×) will cause the leakage current to decrease to about 80 percent of the original value.

The preferred embodiments of the present invention are particularly useful for low BEOL loading devices, such as communication chips used in portable devices. In these devices, since local interconnection lines are typically short, the capacitance has much more impact than the line resistance does and the improvement is more significant.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. An interconnection structure for integrated circuits comprising:
    a first dielectric layer;
    a first conductive line in the first dielectric layer;
    a second dielectric layer over the first dielectric layer and the first conductive line;
    a dual damascene structure in the second dielectric layer, wherein the dual damascene structure comprises:
        a second conductive line; and
        a via between and adjoining the first and the second conductive lines, wherein the second conductive line comprises a first portion directly over and adjoining the via, and a second portion having no underlying and adjoining vias; and
    wherein a second width of the second portion is less than a first width of the first portion; and
    wherein the first width is substantially equal to a width of the via.

2. The interconnection structure of claim 1, wherein the second width is between about 85 percent and about 95 percent of the first width.

3. The interconnection structure of claim 1, wherein the second width is between about 65 percent and about 85 percent of the first width.

4. The interconnection structure of claim 1, wherein the second conductive line has a thickness of no less than a height of the via.

5. The interconnection structure of claim 1 further comprising a third conductive line in a same metallization layer as the second conductive line, wherein the second conductive line and the third conductive line are parallel and have a spacing, and wherein the second width is substantially less than the spacing.

6. The interconnection structure of claim 5, wherein the second width is between about 70 percent and about 95 percent of the spacing.

7. The interconnection structure of claim 5, wherein a width of the first conductive line is between about 70 percent and about 95 percent of the spacing.

8. The interconnection structure of claim 1, wherein the via is connected to an intermediate portion of the second conductive line, with portions of the second conductive line on opposite sides of the via both having the second width.

* * * * *